United States Patent
Rodriguez et al.

(10) Patent No.: US 6,372,638 B1
(45) Date of Patent: Apr. 16, 2002

(54) METHOD FOR FORMING A CONDUCTIVE PLUG BETWEEN CONDUCTIVE LAYERS OF AN INTEGRATED CIRCUIT

(75) Inventors: Robert Arthur Rodriguez; Heather Marie Klesat, both of Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/599,378

(22) Filed: Jun. 22, 2000

Related U.S. Application Data

(63) Continuation of application No. 08/802,299, filed on Feb. 18, 1997, now Pat. No. 6,143,648.

(51) Int. Cl.⁷ ............................................. H01L 21/4763
(52) U.S. Cl. .................... 438/640; 438/633; 438/637; 438/673; 438/713; 257/752; 257/774
(58) Field of Search .................. 438/637, 638, 438/640, 672, 675, 633, 620, 622, 713, 673; 257/752, 750, 774

(56) References Cited

U.S. PATENT DOCUMENTS

| | | | |
|---|---|---|---|
| 4,908,333 A | 3/1990 | Shimokawa et al. | 438/624 |
| 4,970,573 A | 11/1990 | Roberts et al. | 357/71 |
| 4,997,518 A | 3/1991 | Madokoro | 156/643 |
| 5,049,975 A | 9/1991 | Ajika et al. | 357/71 |
| 5,082,801 A * | 1/1992 | Nagata | 438/640 |
| 5,189,506 A | 2/1993 | Cronin et al. | 257/752 |
| 5,854,140 A * | 12/1998 | Jaso | 438/740 |
| 6,143,648 A * | 11/2000 | Rodriguez et al. | 438/640 |

OTHER PUBLICATIONS

Kaanta et al., "Dual Damascene: A ULSI Wiring Technology," VMIC Conference, 9 pgs. (1991).
Kaufman et al., "Chemical–Mechanical Polishing for Fabricating Patterned W Metal Features as Chip Interconnects," J. Electrochem. Soc. vol. 138, No. 11, pp. 3460–3464 (1991).

* cited by examiner

*Primary Examiner*—Charles Bowers
*Assistant Examiner*—Hsien-Ming Lee
(74) *Attorney, Agent, or Firm*—Robert A. Rodriguez; Keith E. Witek

(57) ABSTRACT

A method for forming void free tungsten plug contacts ($56a$–$56c$) begins by etching a contact opening ($55a$–$55c$) using a $C_2F_6$ and $CHF_3$ chemistry. The etch chemistry is then changed to an $O_2$ and $CH_3F$ chemistry in order to insitu remove the contact photoresist while tapering an upper portion of the contact opening. A tungsten deposition process is then performed whereby the tapered portion of the contact reduces the effects of nonconformal and step-coverage-inconsistent tungsten deposition wherein voids in the contact are either substantially reduced or totally avoided within the contact structure. The reduction of or total elimination of voids (22) within the tungsten contact will increase yield, increase reliability, and reduce electromigration failures within integrated circuit devices.

11 Claims, 5 Drawing Sheets

US 6,372,638 B1

METHOD FOR FORMING A CONDUCTIVE PLUG BETWEEN CONDUCTIVE LAYERS OF AN INTEGRATED CIRCUIT

This is a continuation of U.S. patent application Ser. No. 08/802,299, filed on Feb. 18, 1997 now U.S. Pat. No. 6,143,643, which is hereby incorporated by reference, and priority thereto for common subject matter is hereby claimed.

FIELD OF THE INVENTION

The present invention relates generally to integrated circuit manufacturing, and more particularly to, a method for forming tungsten contact plugs in a void-free manner.

BACKGROUND OF THE INVENTION

In the integrated circuit (IC) industry, contacts between polysilicon layers and/or metal layers are sometimes formed using tungsten plugs. As advances are made in lithographic processing and etch technology, the radial opening of an integrated circuit contact continues to shrink while the vertical depth of integrated circuit contacts have been increasing. This increase in contact aspect ratio (depth/radius) creates reliability and manufacturing problems when using tungsten deposition and chemical mechanical polishing (CMP) technology to form tungsten plugs.

The problems arise when tungsten (W) continues in the industry to be used to plug large aspect ratio contacts is illustrated in prior art FIGS. 1–3. As is known in the art, tungsten deposition suffers from highly nonconformal deposition characteristics, also referred to as inconsistent step-coverage. The adverse effects of this non-conformal nature of tungsten deposition is illustrated in FIGS. 1–3.

In FIG. 1, a contact structure 10 is formed by initially providing a base layer 12. A first conductive layer 14 is formed on top of the base layer 12. Layer 14 is lithographically patterned and etched. A dielectric layer 16 is formed overlying the patterned layer 14. The dielectric layer 16 is then patterned then etched to form a contact opening 18 which has a substantially uniform radius X at all elevations through the contact 18 of FIG. 1. FIG. 1 illustrates the beginning of the tungsten deposition process which forms an initial tungsten layer 20a.

In FIG. 1, tungsten is deposited in a highly nonconformal manner. In other words, top surfaces of the dielectric layer 16 will accumulate tungsten material at a much faster rate than the bottom corners of the contact opening 18. Therefore, the shape of the initial stages of tungsten deposition is accurately illustrated in FIG. 1 whereby top portions of the dielectric layer 16 have accumulated a greater thickness of tungsten than lower portions of the contact opening 18.

In FIG. 2, tungsten deposition continues to transform the thinner tungsten layer 20a in FIG. 1 to a thicker tungsten layer 20b in FIG. 2. The tungsten, which continues to deposit in FIG. 2, is also nonconformal and deposits more along the top exposed surfaces of layer 20a and less along the sidewalls and bottom portion of the contact 18. Due to this nonconformal deposition, many contacts formed using a tungsten deposition process will form keyholes or voids 22 as illustrated in FIG. 2. These voids form from the nonconformal deposition nature of tungsten "pinching off" the top opening in the contact hole. The voids 22 resulting from this nonconformal step coverage of tungsten create depressed yields, nonfunctional IC die from electrical open circuits, and electromigration failures over time. Therefore, the presence of the voids 22 in high aspect ratio contacts are disadvantageous and a significant problem for integrated circuit (IC) processing.

FIG. 3 illustrates that a chemical mechanical polishing (CMP) operation is used to form the tungsten plug 20c illustrated in FIG. 3. Note that the void 22 is still present within the contact structure after polishing and therefore is still problematic in the final integrated circuit (IC) device.

Therefore, a need exists for a IC contact formation process which continues to utilize nonconformal tungsten deposition processes while resulting in reduced or totally eliminated void formation.

DETAILED DESCRIPTION OF THE DRAWINGS

Figure 1:
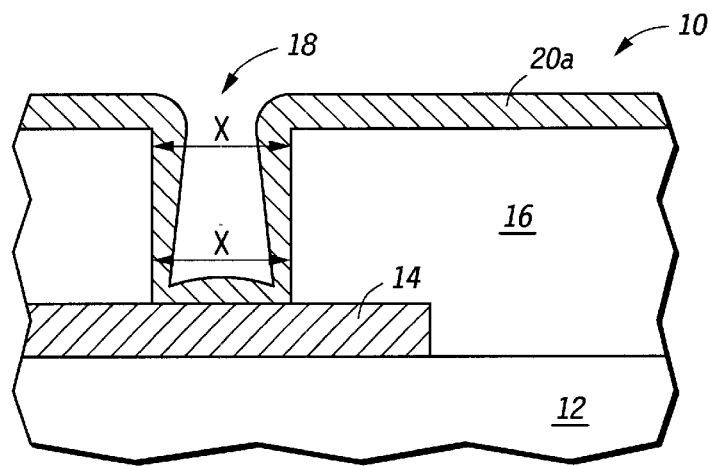
FIGS. 1 through 3 illustrate, in cross-sectional diagrams, a method for forming a prior art contact structure containing unwanted voids.
Figure 2:
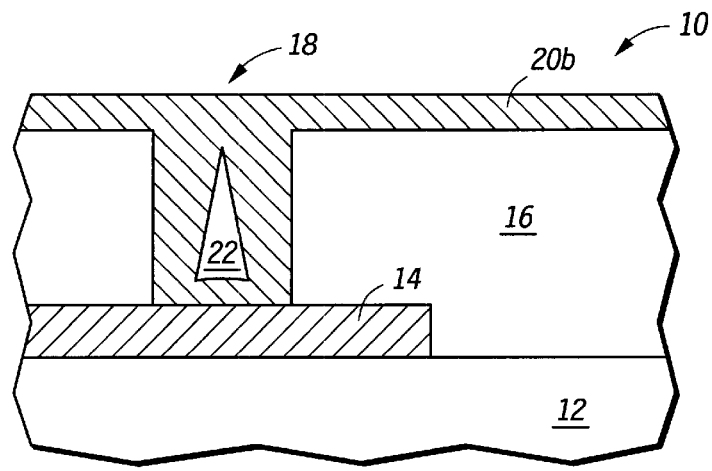
Figure 3:
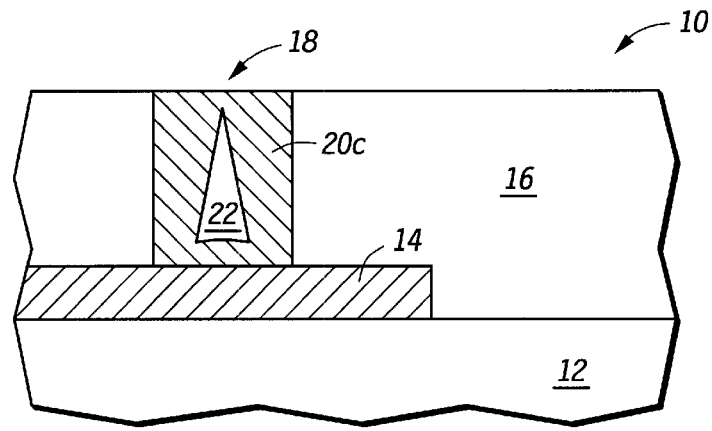

Generally, the present invention is a method for forming a void free tungsten plug contact. The process herein can utilize the same conventional tungsten deposition processes which are highly nonconformal and have step coverage problems without resulting in the void formation illustrated in the FIGS. 1 through 3. Generally, the nonconformal or step coverage problem of conventional tungsten (W) deposition is compensated for by altering the contact profile to a tapered contact unlike the constant radius X contact illustrated in FIG. 1. By using unique etch chemistries to taper the sidewall profile of contacts to form a "golf tee" contact profile or a "wine glass" contact profile, conventional nonconformal and step coverage limited tungsten processing can be used to form tungsten plug contacts with high aspect ratios that have improved yield, greater functional die per wafer, and improved electromigration resistance. In general, void-free or void-reduced contacts formed as taught herein result in integrated circuits (ICs) being formed with higher aspect ratio contacts at a higher yield. In addition, most alterations of contact profiles result in adversely affecting design rule spacing of contact structures. However, the contact profile processes taught herein can be utilized without adversely effecting contact spacing design rules since a chemical mechanical polish (CMP) process is used to remove the widened "golf tee" or "wine glass" contact profile alterations in a final step so that contact spacing is not adversely effected.

The invention can be further understood with reference to FIGS. 4 through 11.

Figure 4:
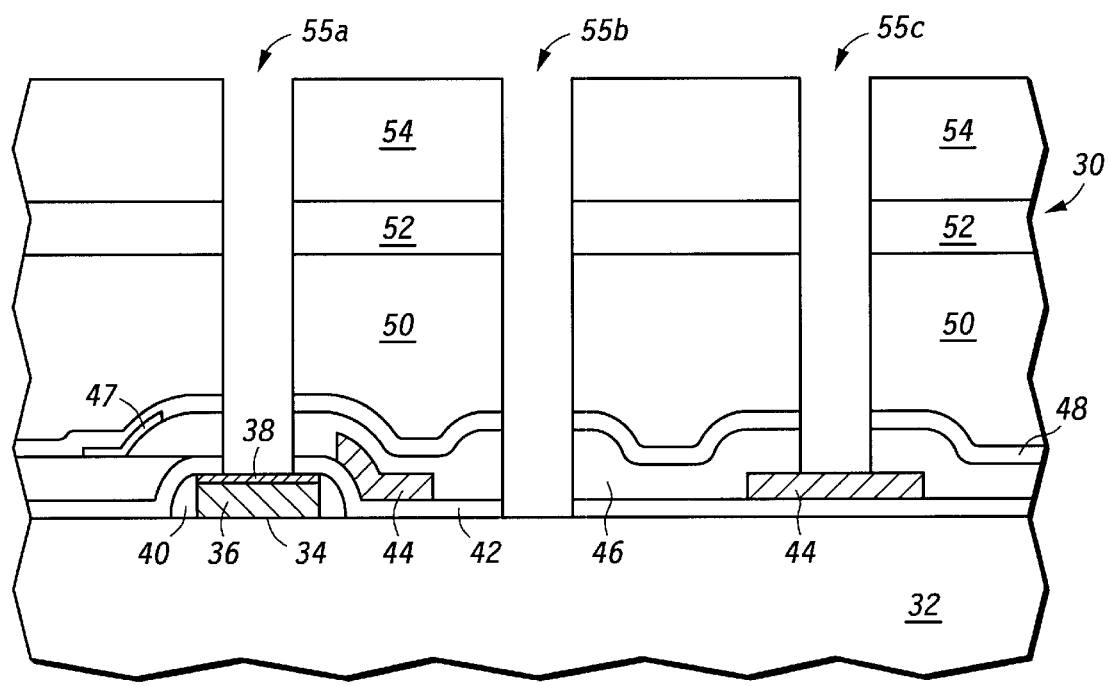
FIGS. 4 through 7 illustrate, in cross-sectional diagrams, a method for forming void free tungsten plug contacts in accordance with the present invention.

FIGS. 4 through 7 illustrate a first method for forming a void free tungsten (W) plug contact structure. FIG. 4 illustrates a substrate 32. Substrate 32 is typically a silicon wafer but can also be a gallium arsenide wafer, a germanium doped layer, epitaxial silicon, a silicon-on-insulator (SOI) substrate, or any like integrated circuit substrate. A gate oxide layer 34 is formed overlying the substrate 32. Gate oxide layer 34 is typically a thermally grown oxide within the range of 35 Å to 120 Å. In alternate embodiments, the gate oxide 34 can be a composite dielectric comprising deposited and/or thermally grown dielectric materials. In addition, the gate oxide 34 may be exposed to a nitrogen or fluorine ambient to incorporate one of either nitrogen or fluorine within the gate oxide 34 to improve overall gate oxide reliability.

A polysilicon or amorphous silicon layer 36 is then deposited over the gate oxide 34. The layer 36 may be formed in a single deposition process or in an A-poly/B-poly process which is known in the art. The layer of polysilicon or amorphous silicon 36 can be optionally silicided via exposure to an environment containing a refractory metal. In addition, the layer of polysilicon or amorphous silicon 36 is covered with a capping layer 38 illustrated in FIG. 4. In a preferred form, the capping layer 38 is silicon nitride, but the capping layer can be any dielectric or conductive layer which performs either an etch stop function and/or anti-reflective coating (ARC) function. The layer of polysilicon or amorphous silicon 36 as well as any silicide and/or capping layer 38 formed over the layer 36 are then photo-lithographically patterned and etched as a stack to form gate electrode portions 36 on the integrated circuit (IC). In addition to forming gate electrodes, portions of layer 36 may be lithographically formed for contact regions, buried contacts, or like polysilicon structures.

After formation of the gate electrode 36 in FIG. 4, sidewall spacers 40 are made in order to enable lightly doped drain (LDD) current electrode formation. The exact current electrodes (source and drain) are not specifically illustrated in FIG. 4. A first tetraethylorthosilicate (TEOS) layer 42 is then formed overlying the spacers 40 in FIG. 4. Other oxides and dielectrics as are known in the art may replace the specific dielectrics and/or oxides taught herein to create other embodiments. A second layer of polysilicon and/or amorphous silicon 44 is deposited and patterned in FIG. 4. Overlying the layer 44, another TEOS layer 46 is deposited. After deposition of the TEOS layer 46, a third polysilicon or amorphous silicon layer is deposited and patterned to form polysilicon regions 47 as illustrated in FIG. 4. Overlying region 47 is another TEOS layer 48, followed by a boro-phosphosilicate glass (BPSG) layer 50. Layer 50 is followed by yet another TEOS layer 52. It should be noted herein that the dielectric layers and conductive layers taught herein can be replaced equivalent dielectric and conductive materials as is known in the art (e.g., silicided polysilicon may replace unsilicided amorphous silicon in some embodiments).

Once the TEOS layer 52 is formed, a photoresist layer 54 is formed on the wafer. The photoresist 54 is then selectively exposed using conventional photoresist processing. The photoresist is then developed to form openings 55a through 55c within the photoresist layer 54 as illustrated in FIG. 4. After defining the opening in the photoresist layer 54, the layers 52, 50, 48, 46, and 42 are then etched in FIG. 4 using a $C_2F_6$ and $CHF_3$ etch environment to extend the opening deeper into the semiconductor device.

In the case of contact 55a, the $C_2F_6$ and $CHF_3$ etch chemistry is selective to the nitride layer 38 so that the contact 55a will continue to etch/deepen until the capping layer 38 is exposed (at which time etching will significantly reduce in rate). In the case of the contact 55b of FIG. 4, the $C_2F_6$ and $CHF_3$ etch chemistry is selective to the semiconductor substrate 32. Furthermore, the $C_2F_6$ and $CHF_3$ used to etch the contact 55c is selective to the polysilicon and/or amorphous silicon 44. Therefore, the three contact openings 55a through 55c are formed as illustrated in FIG. 4 using a reactive ion etch (RIE) or like plasma etch environment. In addition, it is important to note that there are other oxide etch chemistries and processes other than $C_2F_6$ and/or $CHF_3$ which may be used herein to etch the contacts 55a through 55c.

Figure 5:
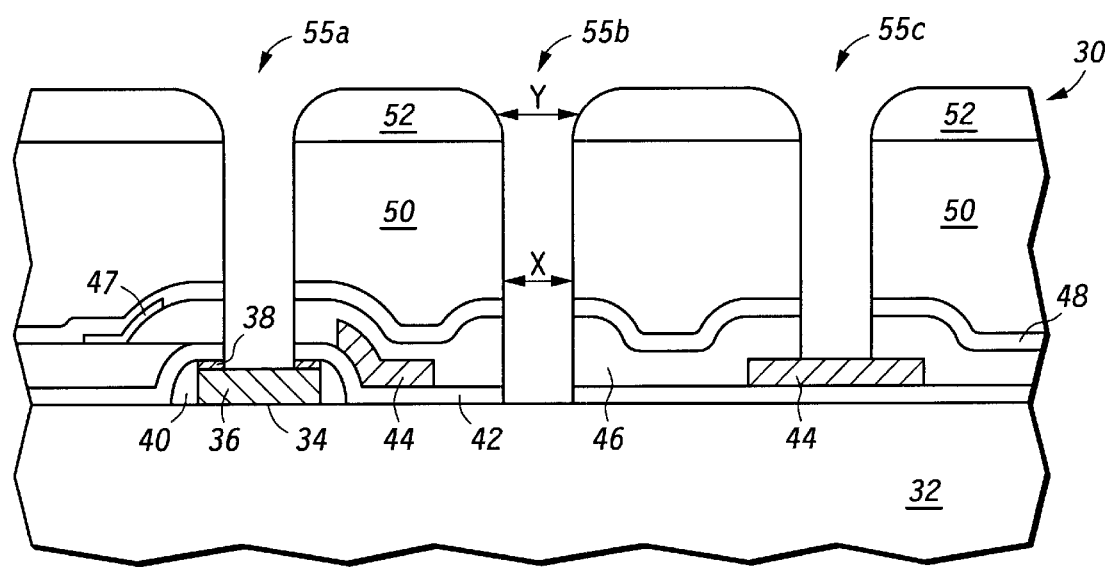

FIG. 5 illustrates that the photoresist 54 of FIG. 4 is removed. This removal can be performed in one of two manners. In a preferred form, the photoresist 54 is removed from the wafer by using an in situ $CH_3F$ and $O_2$ etch environment. In another form, a purely exsitu $O_2$ chemistry may be used to remove the photoresist in a different processing chamber other than the etch chamber than the chamber used to perform the etching illustrated in FIG. 4. After the photoresist 54 is removed from the wafer in FIG. 5, the wafer is exposed to a $CH_3F$ and $O_2$ environment to perform tapering of an upper portion of the contact openings 55a through 55c. In a preferred form, the $CH_3F$ etch chamber and etch plasma used to perform the contact taper process in the same or similar process used to perform the preferred in situ photoresist removal. In addition, the same $CH_3F$ etch chamber and etch plasma used to perform the contact taper process can simultaneously be used to remove the silicon nitride used to form the capping layer 38 from the bottom of the contact opening 55a as shown in FIG. 5.

As illustrated in FIG. 5, the contact tapering operation results in an upper portion of the contacts 55a through 55c being enlarged to a radius Y wherein the radius Y of FIG. 5 is greater than the radius X formed via the etching of FIG. 4. The radius X of FIG. 5 is identical to the radius X of FIG. 1, and is typically a minimum lithographic dimension allowed by the specific lithographic equipment utilized in the manufacture of the contact structure. The exposure of the wafer to the $CH_3F$ and $O_2$ plasma etch environment results in a rounding of the upper corners of the contact openings 55a through 55c to form a "golf tee" profile. In Table 1 below, the etch process discussed above with respect to FIG. 4 through FIG. 5 is summarized in a Table 1:

TABLE 1

|  | Main Contact Etch | Resist Strip and Taper Etch | Polymer Removal Step |
| --- | --- | --- | --- |
| Source Power (Watts) | 2800 ± 20% | 1800 ± 20% | 2600 ± 20% |
| Bias Power (Watts) | 1400 ± 20% | 250 ± 20% | 300 ± 20% |
| Pressure (mTorr/Tv) | 10 ± 20% | 20 ± 20% | 25 ± 20% |
| Time (sec) | 210 ± 20% | 60 ± 50% | 60 ± 20% |
| $C_2F_6$ (sccm) | 40 ± 20% |  |  |
| $CHF_3$ (sccm) | 15 ± 20% |  |  |
| $CH_3F$ (sccm) |  | 40 ± 20% |  |
| He (sccm) | 75 ± 20% |  |  |
| $O_2$ (sccm) |  | 80 ± 20% | 95 ± 20% |

Etch Process for Forming the Contacts 55a–55c of FIGS. 4–5 Using an Applied 5300 Centura HDP Oxide Etcher As Table 1 illustrates, the contacts illustrated in FIGS. 4 through 5 are formed by a three step etch process. A first step, which is referred to as the main contact etch, is used to form the openings 55a–55c as they are illustrated in FIG. 4. The main contact etch of Table 1 shows values for preferred power, pressure, etch time, and gas flow wherein these preferred values can be altered around the middle optimal operating point by roughly 20%.

Table 1 also illustrates the resist strip and taper etch which is used in FIG. 5 to remove the photoresist 54 in an in situ manner, to taper the top portions of the openings 55a through 55c, and to remove the portion of the layer 38 within the opening 55a. The time needed to perform the resist strip and taper etch can vary around a preferred time of sixty seconds by up to 50% due to the fact that the taper profile can be controlled significantly by controlling etch time. Some tungsten deposition processes and equipment may require more or less Y-radius taper than other tungsten processes, or etch time may be used to control the shape of the taper. The amount of taper required is also a function of the aspect ratio of the contact openings which are initially formed in FIG. 4.

In addition to the main contact etch followed by the resist strip and taper etch, a final polymer etch removal etch step is illustrated in Table 1. The third etch step of Table 1, referred to as the polymer removal step, removes polymer byproducts of the etch plasma from the contact openings and/or oxide surfaces. Typically, polymers are intended to be formed on various integrated circuits surfaces during etching in order to effect selectivity of the etch process. While these polymer layers are beneficial to selectivity, they should be subsequently removed to avoid significant contact resistance deviations, adhesion problems, open circuits, etc. This final etch step therefore ensures that any of these polymer byproducts are properly removed so that the final contact structure is not adversely effected.

Figure 6:
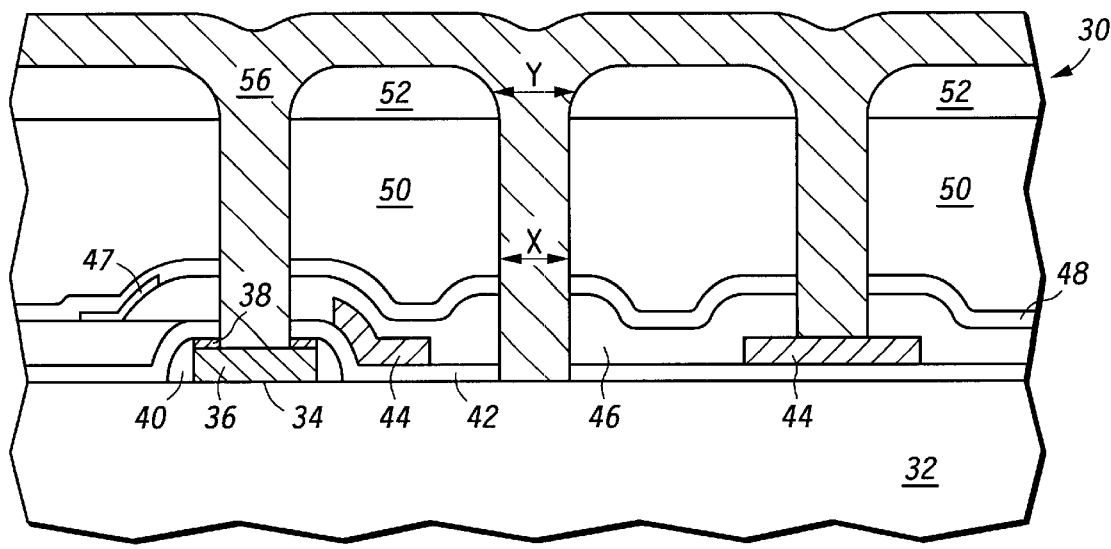

After formation of the etch contact as illustrated in FIG. 5, a tungsten (W) deposition process is performed to form a layer of tungsten 56 as shown in FIG. 6. Due to the tapered/rounded "golf tee" corners of the contacts 55a through 55c in FIG. 5, the inherent nonconformal step coverage characteristics of tungsten deposition processing are compensated for so that keyhole or voids are reduced or totally eliminated within the contact openings 55a–55c.

While voids have now been avoided, the issue of leaving wider Y radius contacts intact on a substrate is problematic. The larger the opening of any portion of a contact, the greater the spacing between contacts must be to avoid electrical cross-coupling or to avoid photographic misalignment defects. Therefore, subsequent processing in FIG. 7 is used to remove the wider contact portion Y to leave behind only the smaller void-free contact portion X so that design rules are not compromised by the void-free etch process discussed above.

In essence, as is illustrated in FIG. 6, an upper portion of the contacts 55a through 55c will contain a wider portion Y of conductive material than lower portions of the contact having a radius X. If the upper portion having a radius Y were allowed to remain on the final semiconductor device, physical design rule spacing between contacts would be increased and the size of memory cells and like spacing critical structures would be adversely affected. To remedy this problem, a CMP process is used not only to form the actual tungsten (W) plugs themselves, but to remove the taper Y from the final contact structure so that close contact pitch design rules can be preserved in the design rules to maximal circuit densities.

Figure 7:
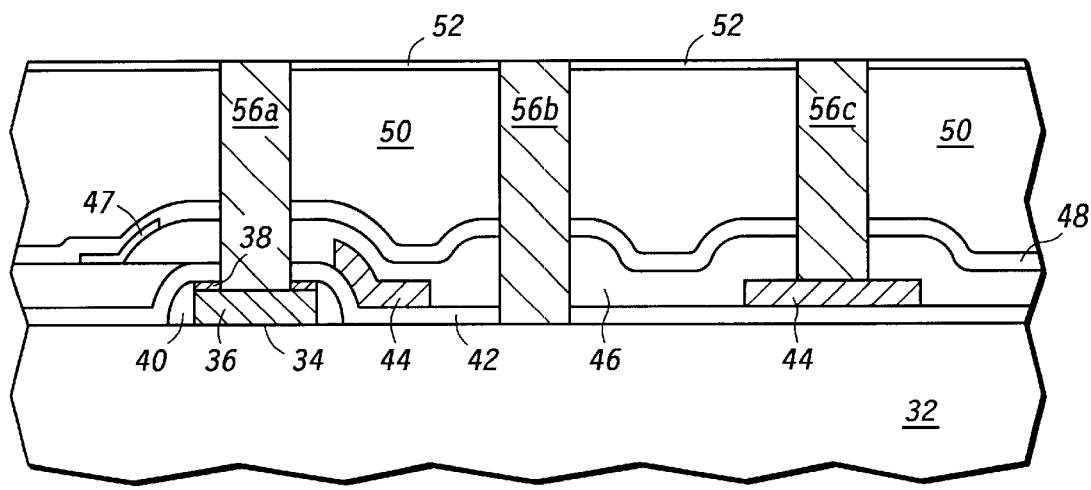

To this end, FIG. 7 illustrates a chemical mechanical polishing (CMP) process which is used to planerize surfaces to form plug regions 56a through 56c in FIG. 7 and to remove the widened, tapered, upper contact profile Y of all of the contacts 55a through 55c. The resulting contacts of FIG. 7 are void free tungsten plugs which are improved over the prior art illustrated in FIG. 3. It is important to note that a polish stop layer (e.g. silicon nitride, not specifically illustrated in FIGS. 4–7) can be optionally formed between the layers 50 and 52 of FIG. 4 to improve the polish process at the expense of complicating the contact etch process. In another, more preferred embodiment, a timed polish process can be utilized with no need for a polish stop layer. Any polish process which removes both the tungsten (W) top portions and the TEOS/BPSG oxides may be utilized in FIG. 7.

It is important to note that the layer 50 of FIG. 7 is preferably a BPSG layer. These doped oxide layers are typically not allowed to be in contact with conductive layers. For this reasons, at least a thin portion of TEOS layer 52 is left overlying the surface of the BPSG layer 50 after CMP operations to ensure that the BPSG layer is properly insulated from overlying conductive layers (subsequently formed and not illustrated in FIG. 7). The thickness of layer 52 can be adjusted to ensure proper BPSG isolation as is needed in the final contact structure.

It is important to note that the device of FIGS. 4 through 7 is preferably a static random access memory (SRAM) cell. In this preferred SRAM embodiment, the layer 36 is a gate electrode for a MOS transistor within an SRAM cell. The layer 44 is used to form SRAM output node contacts to the storage nodes of the SRAM cell. The layer 47 is a thin layer of polysilicon less than 1000 Å in thickness which is used to form a polysilicon resistor for the SRAM cell, In the alternative, the layer 47 may be used to form a thicker thin film transistor (TFT) structure within the SRAM cell in place of polysilicon SRAM load resistors. Therefore, FIG. 7 illustrates that the contacts 55a through 55c may be used to contact three different conductive levels within an integrated circuit (IC) and preferably within an SRAM cell. It is important to note that this contact process may also be used in microprocessors, other memory devices (i.e., EEPROM, EPROM, DRAM, ferroelectric devices, flash memory, etc.) or any semiconductor device fabrication process using plug contacts.

Figure 8:
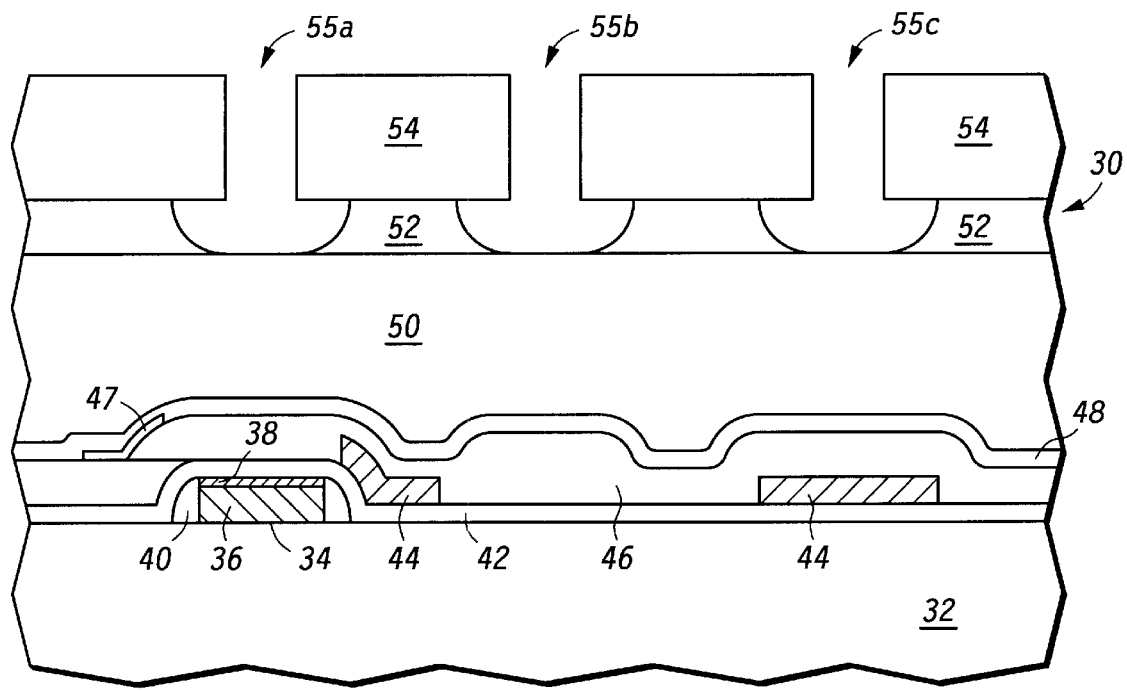
FIGS. 8 through 11 illustrate, in cross-sectional diagrams, an alternative method for forming void free tungsten plug contacts in accordance with the present invention.

FIGS. 8 through 11 illustrate an alternate embodiment of the present invention whereby void free tungsten (W) plug contacts can be formed. The layers or material 32 through 54 of FIG. 8 are identical or very similar to the material discussed in FIGS. 4 through 7. Identical layers between FIGS. 4–7 and FIGS. 8–11 are labeled with identical reference numerals and not further explained below.

FIG. 8 illustrates the photoresist layer 54. The photoresist layer is patterned with the three openings 55a through 55c similar to that illustrated in FIG. 4. The dielectric layer 52 of FIG. 8 is then exposed to an isotropic etch chemistry. A typical isotropic etch process comprises pressurizing a chamber to 1400 millitorr. This chamber is provided with an RF power of 700 watts, an $NF_3$ flow of 480 ccm, a helium (He) carrier gas flow of 540 ccm, for a time duration of roughly thirty seconds. The exposure to this $NF_3$ etch chemistry results in a bowl-shaped, tapered profile, referred to as a "wine glass" profile, as illustrated in FIG. 8.

Figure 9:
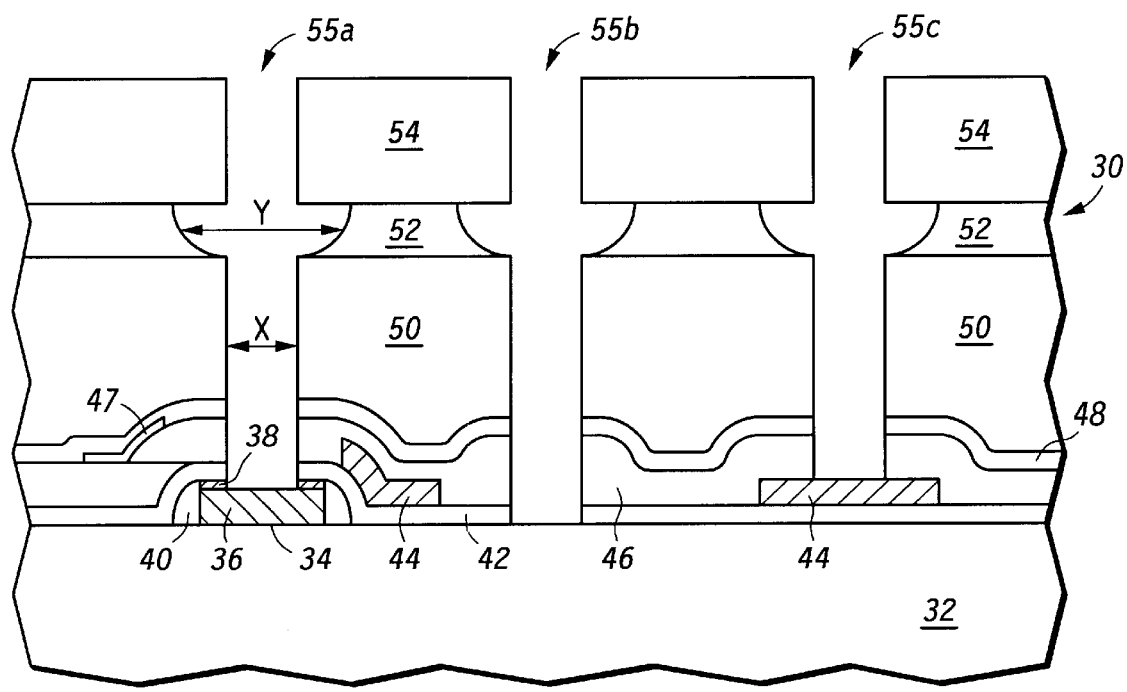

Once the isotropic etch of FIG. 8 is performed, a reactive ion etch (RIE) or a like plasma etch is utilized, as discussed previously for FIG. 4, to form the remaining portion of the contact opening illustrated in FIG. 9. In addition, a silicon nitride etch step is then used to remove the nitride capping layer 38 off of the polysilicon gate electrode 36 of FIG. 9 in either an exsitu or in situ manner. Therefore, the contact structures 55a through 55c of FIG. 9 have a tapered structure wherein an upper radius of the contact has a radius Y and a lower portion of the contact has a radius X similar to that illustrated in FIG. 5. Unlike the anisotropic plasma etch taper process illustrated in FIG. 5, the isotropic taper process of FIG. 9 results in a differently-sloped contact profile. The profile of FIG. 4 is referred to as a "golf tee profile". Whereas, the profile of FIG. 9 is a "wine glass" profile.

Figure 10:
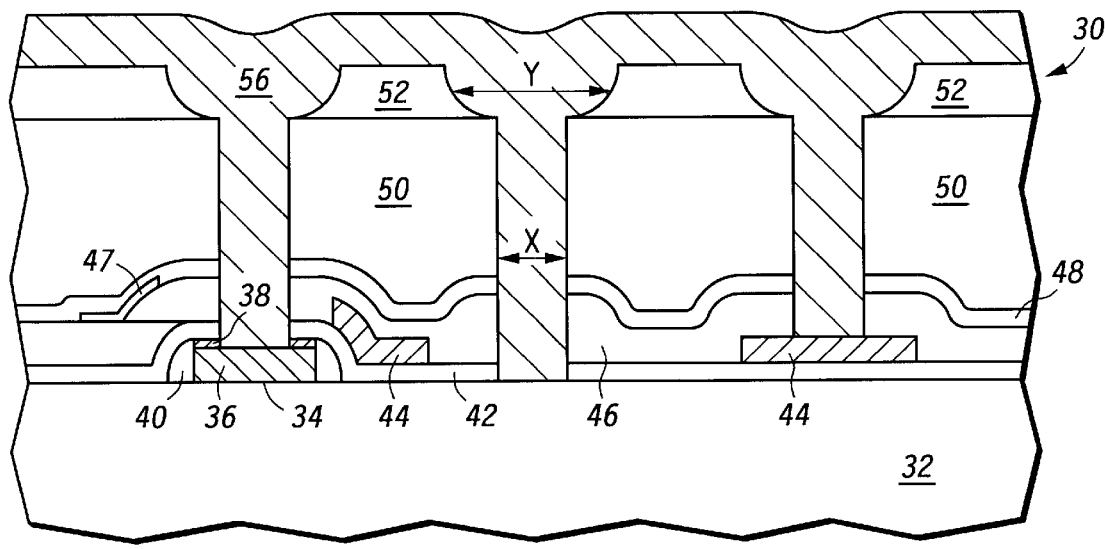

In FIG. 10, the photoresist layer 54 of FIG. 9 is removed either via an in situ etch or an exsitu process comprising one or more of O₂ and CH₃F. Once the photoresist layer 54 has been removed, a tungsten (W) deposition process is performed in order to form a tungsten layer 56 as illustrated in FIG. 10. The presence of the upper tapered contact portion, having a radius of roughly equal to Y, results in the reduction or total elimination of the void formation associated with the nonconformal step coverage typically associated with tungsten deposition.

Figure 11:
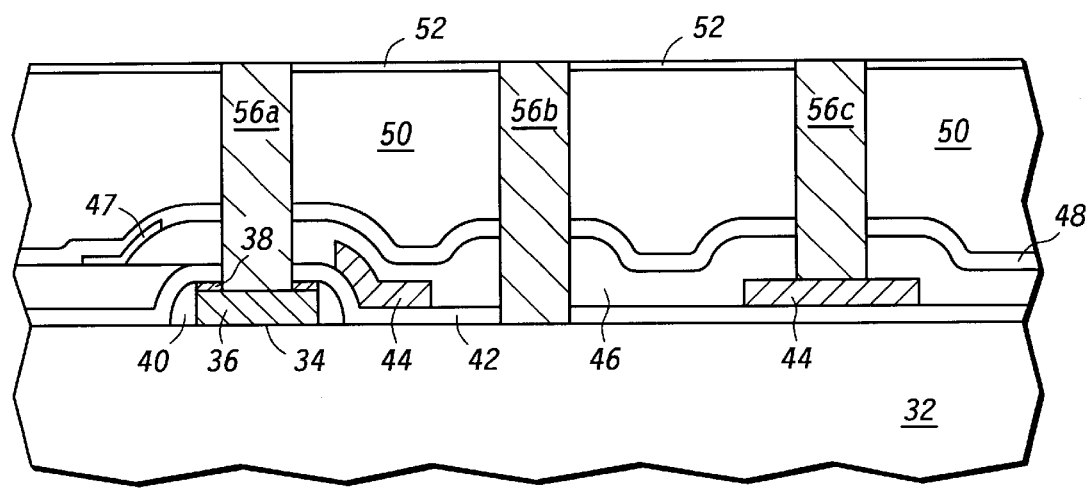

As also illustrated in FIG. 7, FIG. 11 illustrates a chemical mechanical polish (CMP) step which is used to polish the top isotropically etched portion Y of the contact profiles as well as top portions of the tungsten 56 to form a conductive contact plug. This CMP process not only forms the tungsten plugs 56a through 56c in FIG. 11 but also ensures the same minimal spacing separation distances for design rules formed used for conventional voided contacts of FIGS. 1–3.

Therefore, it is apparent that there has been provided, in accordance with the present invention, a method for forming a tungsten (W) contact structure in a void free manner. Although the invention has been described and illustrated with reference to specific embodiments, it is not intended that the invention be limited to these illustrative embodiments. The method taught herein can be used for forming dual Damascene or dual inlaid contact structures as well as plug contact structures. The process taught herein can be utilized with other metallic material other than tungsten (W). For example, aluminum, copper, or like conductive materials can be formed using the contact profile techniques taught herein. Therefore, those skilled in the art will recognize that modifications and variations may be made herein without departing from the spirit and scope of the invention. Therefore, it is intended that this invention encompass all variations and modifications as fall within the scope of the appended claims.

What is claimed is:

1. A method for forming a contact structure, the method comprising the steps of:

forming a first conductive material overlying a semiconductor substrate;

forming a dielectric layer overlying the first conductive layer;

forming a resist layer over the dielectric layer;

patterning the resist layer to form an opening that exposes portions of the dielectric layer;

placing the semiconductor substrate into a reactive ion etching chamber and in-situ processing the semiconductor substrate as follows:

etching portions of the dielectric layer using a gas mixture that includes a fluorocarbon source gas to form an opening in the dielectric layer, the opening having a bottom portion and a sidewall portion;

etching a portion of the resist layer using a gas mixture that includes a fluorocarbon source gas and an oxygen source gas to remove the portion of the resist layer and expose a top surface portion of the dielectric layer adjacent the sidewall portion;

etching the top surface portion of the dielectric layer adjacent the sidewall portion to form a taper that extends between a top surface of the dielectric layer and the sidewall portion, wherein the taper towards the top surface portion has a radius Y and the taper towards the sidewall portion has a radius X wherein X<Y; and removing remaining portions of the resist layer;

depositing a second conductive material within the opening; and polishing away a top portion of the conductive material and a top portion of the dielectric layer to remove the taper.

2. The method of claim 1, wherein the second conductive material comprises tungsten.

3. The method of claim 1, wherein removing remaining portions of the resist layer is performed as part of in situ-processing in the reactive ion etching chamber.

4. The method of claim 1 further comprising using the top portion of the opening having the radius Y to reduce void formation in the contact structure due to the step of depositing.

5. The method of claim 1, wherein the step of forming the first conductive layer comprises forming the first conductive layer as a gate electrode which gates a transistor in an SRAM cell.

6. The method of claim 1, wherein forming the first conductive layer is further characterized as forming a polysilicon layer which is coupled to a storage node of an SRAM cell.

7. The method of claim 1, wherein the step of forming the first conductive layer comprises forming the first conductive layer as a doped current electrode for a transistor within a substrate, the transistor being coupled in an SRAM cell.

8. A method for forming an integrated circuit, the method comprising:

patterning a resist layer over a dielectric layer;

anisotropically etching portions of the dielectric layer exposed by the resist layer to define an opening in the dielectric layer, wherein:

the opening includes a top portion that is adjacent an upper surface of the dielectric layer, a bottom portion that is opposite the top portion, and a sidewall portion that is disposed between the top portion and the bottom portion;

removing the resist layer;

tapering the top portion of the opening using an anisotropic etching process after removing of the resist layer;

depositing a material over portions of the upper surface of the dielectric layer and within the opening; and polishing to remove (1) the material over portions of the upper surface of the dielectric layer and (2) the top portion of the opening including the taper and portions of the material contained within the top portion.

9. The method of claim 8, wherein the material includes a conductive material.

10. The method of claim 9 wherein the conductive material is further characterized as a tungsten material.

11. A method for forming an integrated circuit, the method comprising: patterning a resist layer over a dielectric layer;

anisotropically etching portions of the dielectric layer exposed by the resist layer to substantially define a top portion of the opening that is adjacent an upper surface of the dielectric layer, a bottom portion of the opening that is opposite the top portion, and a sidewall portion of the opening that is disposed between the top portion and the bottom portion;

tapering the top portion of the opening using an anisotropic etch process while removing the resist layer;

depositing a material over portions of the upper surface of the dielectric layer and within the opening; and polishing to remove the material over portions of the upper surface of the dielectric layer and the top portion of the opening including the taper and portions of the material contained within the top portion.

\* \* \* \* \*